United States Patent
Franke et al.

(10) Patent No.: US 9,576,812 B2
(45) Date of Patent: Feb. 21, 2017

(54) PARTIAL ETCH MEMORIZATION VIA FLASH ADDITION

(71) Applicant: Tokyo Electron Limited, Minato-ku, Tokyo (JP)

(72) Inventors: Elliott Franke, Albany, NY (US); Vinayak Rastogi, Albany, NY (US); Akiteru Ko, Schenectady, NY (US); Kiyohito Ito, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/085,186

(22) Filed: Mar. 30, 2016

(65) Prior Publication Data

US 2016/0293435 A1 Oct. 6, 2016

Related U.S. Application Data

(60) Provisional application No. 62/142,350, filed on Apr. 2, 2015.

(51) Int. Cl.

| | |
|---|---|
| *H01L 21/311* | (2006.01) |
| *H01L 21/3065* | (2006.01) |
| *H01J 37/32* | (2006.01) |
| *H01L 21/308* | (2006.01) |
| *H01L 21/67* | (2006.01) |

(52) U.S. Cl.
CPC ... *H01L 21/30655* (2013.01); *H01J 37/32009* (2013.01); *H01L 21/3081* (2013.01); *H01L 21/3086* (2013.01); *H01L 21/67069* (2013.01); *H01J 2237/334* (2013.01)

(58) Field of Classification Search
USPC .................................................. 438/696
See application file for complete search history.

(56) References Cited

U.S. PATENT DOCUMENTS

| 2002/0115293 A1 | 8/2002 | Ghodsian |
| 2003/0032297 A1 | 2/2003 | Lindstrom et al. |

(Continued)

FOREIGN PATENT DOCUMENTS

JP    2014-225638    12/2014

OTHER PUBLICATIONS

International Patent Application No. PCT/US2016/024241, "International Search Report and Written Opinion," mailed Jun. 27, International Filing Date Mar. 25, 2016.

*Primary Examiner* — Roberts Culbert

(57) ABSTRACT

Provided is a method of creating structure profiles on a substrate using faceting and passivation layers. A first plasma etch process performed generating a faceted sidewall and a desired inflection point; a second plasma etch process is performed using an oxygen, nitrogen, or combined oxygen and nitrogen plasma, generating a passivation layer; and a third plasma etch process using operating variables of an etch chemistry on the faceted sidewall and the passivation layer to induce differential etch rates to achieve a breakthrough on near-horizontal surfaces of the structure, wherein the third plasma etch used is configured to produce a target sidewall profile on the substrate down to the underlying stop layer. Selected two or more plasma etch variables are controlled in the performance of the first plasma etch process, the second plasma etch process, and/or the third plasma etch process in order to achieve target sidewall profile objectives.

27 Claims, 10 Drawing Sheets

(56) References Cited

U.S. PATENT DOCUMENTS

| | | |
|---|---|---|
| 2008/0038927 A1 | 2/2008 | Yamaguchi et al. |
| 2014/0045338 A1* | 2/2014 | Tohnoe .............. H01L 21/3065 438/719 |
| 2014/0187035 A1 | 7/2014 | Posseme et al. |

* cited by examiner

PARTIAL ETCH MEMORIZATION VIA FLASH ADDITION

BACKGROUND OF THE INVENTION

Field of Invention

The present invention relates to a method and system for substrate processing, and more particularly to a method and system for patterning sidewall shapes using sidewall faceting and flash addition or passivation growth.

Description of Related Art

As feature scaling continues to dominate microelectronic development, the creation of specific structures can be a costly and complex process. Often these processes can be difficult to control. The following is a methodology to simply create a unique structure profile that has many future applications.

This invention relates to dry plasma processing using well known etch characteristics of sidewall faceting and growth of passivation layers to create new, unique, and novel silicon profiles. Employing relative etch rates of a secondary, in-situ grown, hard mask due to faceted surfaces allows for successful pattern transfer. There is a need for a set of processes that can be controlled to generate target sidewall profiles of structures for specific applications.

SUMMARY OF THE INVENTION

Provided is a method of creating structure profiles on a substrate using faceting and passivation layers. A first plasma etch process performed generating a faceted sidewall and a desired inflection point; a second plasma etch process is performed using an oxygen, nitrogen, or combined oxygen and nitrogen plasma, generating a passivation layer; and a third plasma etch process using operating variables of an etch chemistry on the faceted sidewall and the passivation layer to induce differential etch rates to achieve a breakthrough on near-horizontal surfaces of the structure, wherein the third plasma etch used is configured to produce a target sidewall profile on the substrate down to the underlying stop layer. Selected two or more plasma etch variables are controlled in the performance of the first plasma etch process, the second plasma etch process, and/or the third plasma etch process in order to achieve target sidewall profile objectives.

Also provided is a system for processing a substrate in order to achieve target sidewall target profile, the system comprising: an etch system comprising a process chamber coupled to plasma generator, an etchant gas delivery system, a controller, a power source, and a vacuum system, wherein the etch system is configured to perform a first plasma etch process generating a faceted sidewall on the substrate, the etch process etching around the pattern hard mask down to a desired inflection point; a second plasma etch process using an oxygen, nitrogen, or combined oxygen and nitrogen plasma, the second plasma etch process generating a passivation layer; and a third plasma etch process using operating variables of an etch chemistry on the faceted sidewall and the passivation layer to induce differential etch rates to achieve a breakthrough on near-horizontal surfaces of the structure, wherein the third plasma etch used is configured to produce a target sidewall profile on the substrate down to the underlying stop layer; wherein use of a faceting technique and a passivation layer are combined to achieve target sidewall profile objectives for the structure.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1A:
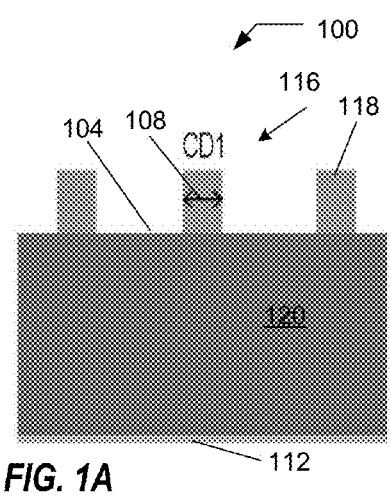
FIG. 1A depicts an exemplary structure profile schematic of an incoming film stack of an integration scheme in an embodiment of the present invention.

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1A depicts an exemplary structure profile schematic 100 of an film stack 116 of a substrate 120 in an integration scheme in an embodiment of the present invention. The film stack 116 comprises a patterned hard mask 118 with a first critical dimension (CD1), and underlying stop layer 112.

Figure 1B:
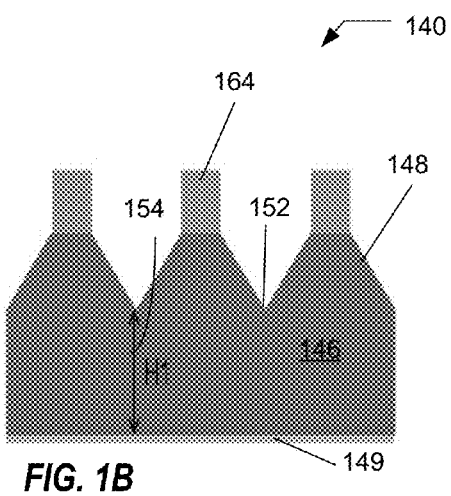
FIG. 1B depicts an exemplary structure profile schematic after a first plasma etch of an integration scheme in an embodiment of the present invention.

FIG. 1B depicts an exemplary structure profile schematic 140 after a first plasma etch in an integration scheme in an embodiment of the present invention. The first plasma etch process etches around the patterned hard mask 164 down to an inflection point 152 leaving a height H1 of the substrate 146.

Figure 1C:
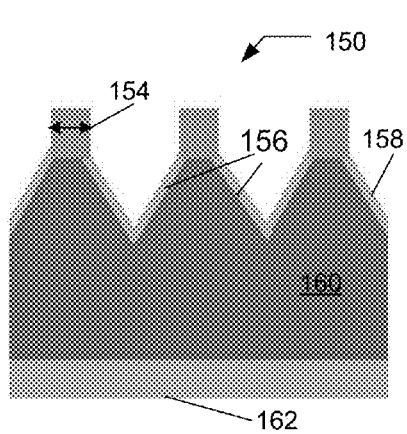
FIG. 1C depicts an exemplary structure profile schematic after a second plasma etch of an integration scheme in an embodiment of the present invention.

FIG. 1C depicts an exemplary structure profile schematic 150 after a second plasma etch of an integration scheme in an embodiment of the present invention. The second plasma etch applies a flash addition or passivation layer 156 on top of the faceting 158 of the substrate 160.

Figure 1D:
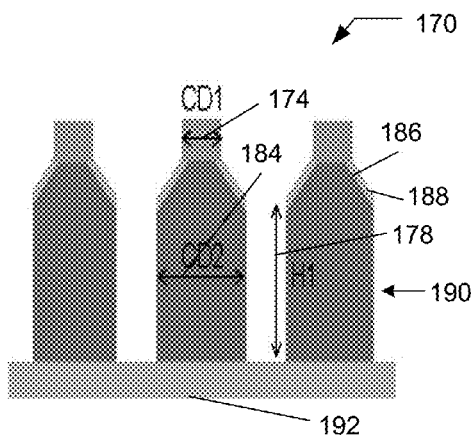
FIG. 1D depicts an exemplary structure profile schematic after a third plasma etch of an integration scheme in an embodiment of the present invention.

FIG. 1D depicts an exemplary structure profile schematic 170 after a third plasma etch of an integration scheme in an embodiment of the present invention. Using operating variables of an etch chemistry on the faceted sidewall 186 and the passivation layer 188 to induce differential etch rates to achieve a breakthrough on near-horizontal surfaces of the structure, wherein the third plasma etch used is configured to produce a target sidewall profile on the substrate 190 down to the underlying stop layer 192. The series of plasma etch processes is configured to achieve targets of CD1, second critical dimension CD2, and structure height H1 of the substrate 190.

Figure 2A:
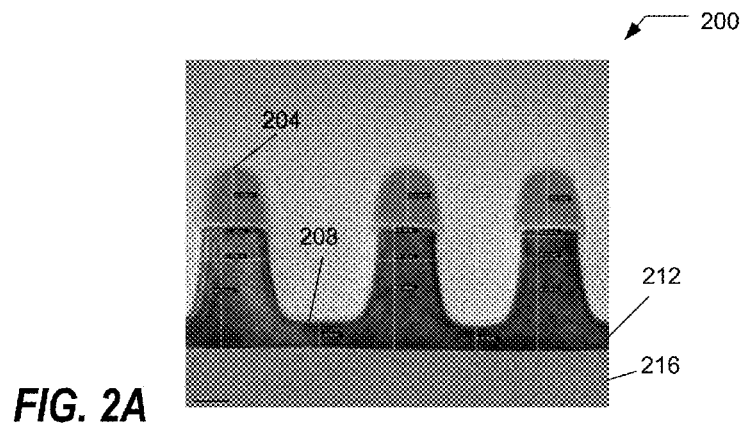
FIG. 2A depicts an exemplary structure image after a first plasma etch of an integration scheme in an embodiment of the present invention.

FIG. 2A depicts an exemplary structure image 200 after a first plasma etch of an integration scheme in an embodiment of the present invention. The hard mask 204 is on top of the substrate 212 above the underlying stop layer 216. Etching of the substrate 212 removed parts of the substrate 212 not protected by the hard mask 204 to a level shown by the faceting 208 in the sidewall.

Figure 2B:
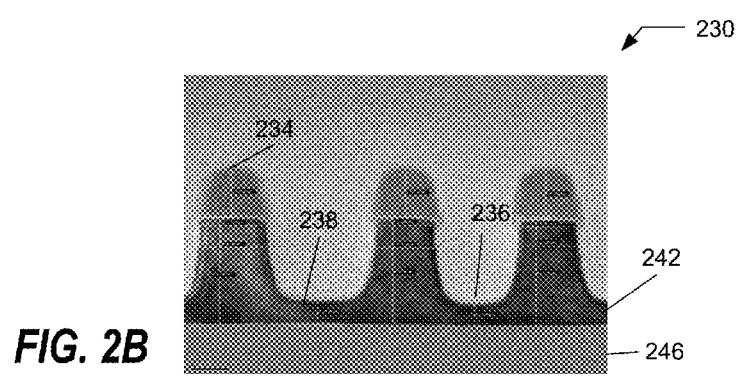
FIG. 2B depicts an exemplary structure image after a second plasma etch of an integration scheme in an embodiment of the present invention.

FIG. 2B depicts an exemplary structure image 230 after a second plasma etch of an integration scheme in an embodiment of the present invention. A flash addition or passivation layer 236 is the result of the second plasma etch using an oxygen, nitrogen or combined oxygen and nitrogen flash addition to the surface of the facet 238.

Figure 2C:
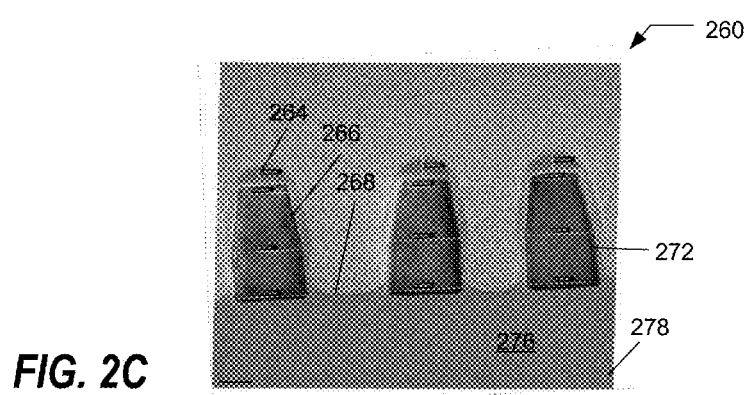
FIG. 2C depicts an exemplary structure image after a third plasma etch of an integration scheme in an embodiment of the present invention.

FIG. 2C depicts an exemplary structure image 260 after a third plasma etch of an integration scheme in an embodiment of the present invention. As mentioned above, using operating variables of an etch chemistry on the faceted sidewall 266 and the passivation layer 268 to induce differential etch rates to achieve a breakthrough on near-horizontal surfaces of the structure 272, wherein the third plasma etch used is configured to retain the hard mask 264 and produce a target sidewall profile 268 on the substrate 276 down to the underlying stop layer 278.

Figure 3A:
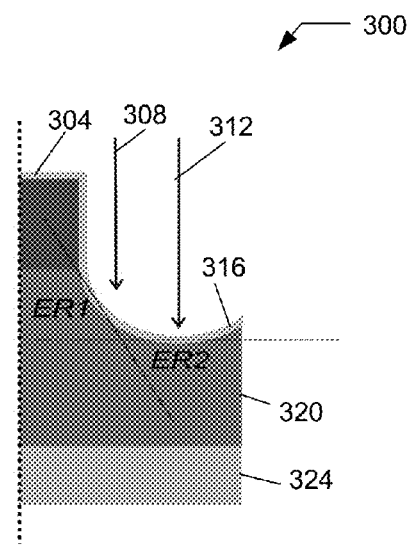
FIG. 3A is an exemplary simplified profile schematic of a structure highlighting the differential etch rate on near-horizontal surfaces.

FIG. 3A is an exemplary simplified profile schematic 300 of a structure highlighting the differential etch rate on near-horizontal surfaces. The hard mask 304 protects the top of the structure from the etching processes. The flash addition or passivation layer 316 also protects the near-vertical surfaces 308 and lesser protection to the near-horizontal surfaces 312 of the substrate 320 above the underlying stop layer 354. As mentioned above, differential etch rates such as etch rate 1 (ER1) on the near-vertical surface 308 versus etch rate 2 (ER2) are used to achieve a breakthrough on near-horizontal surfaces 316 of the structure, wherein the third plasma etch used is configured to retain the hard mask 304 and produce a target sidewall profile 312 on the substrate 320 down to the underlying stop layer 324.

Figure 3B:
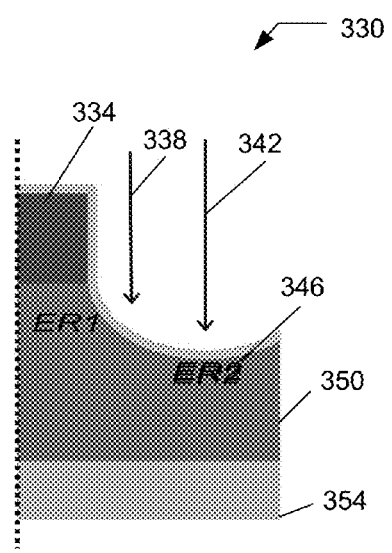
FIG. 3B is an exemplary simplified profile schematic of a structure highlighting the protection rate on near-vertical surfaces.

FIG. 3B is an exemplary simplified profile schematic 330 of a structure highlighting the protection rate on near-vertical surfaces. The hard mask 334 protects the top of the structure from the etching processes. The flash addition or passivation layer 346 also protects the near-vertical surfaces 338 and lesser protection to the near-horizontal surfaces 342 of the substrate 350 above the underlying stop layer 354. Compared to FIG. 3A, differential etch rates such as etch rate 1 (ER1) on the near-vertical surface 338 versus etch rate 2 (ER2) are used to achieve a breakthrough on near-horizontal surfaces 342 of the structure are more pronounced in those shown in FIG. 3B wherein the third plasma etch used is configured to retain the hard mask 334 and produce a larger and deeper target sidewall profile 342 on the substrate 350 down to the underlying stop layer 354.

Figure 4A:
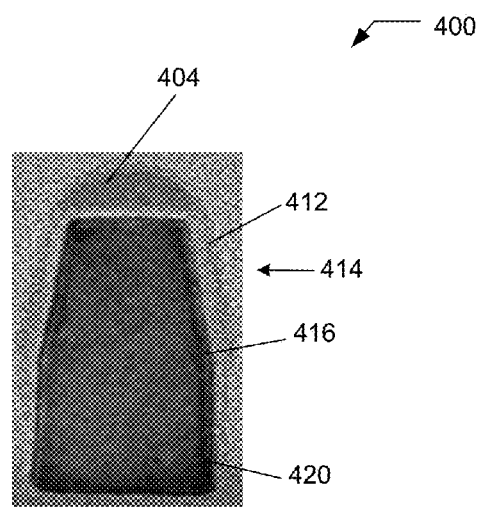
FIG. 4A is an exemplary image of a structure and the protection provided by the passivation layer in an embodiment of the present invention.

FIG. 4A is an exemplary image 400 of the structure and the protection provided by the passivation layer in an embodiment of the present invention. A hexagonal structure 414 is the result of the first, second, and third plasma etch processes where the hard mask 404 is retained and the near-vertical surfaces 412 are relatively protected and the near-horizontal surfaces 420 have been etched starting at the inflection point 416.

Figure 4B:
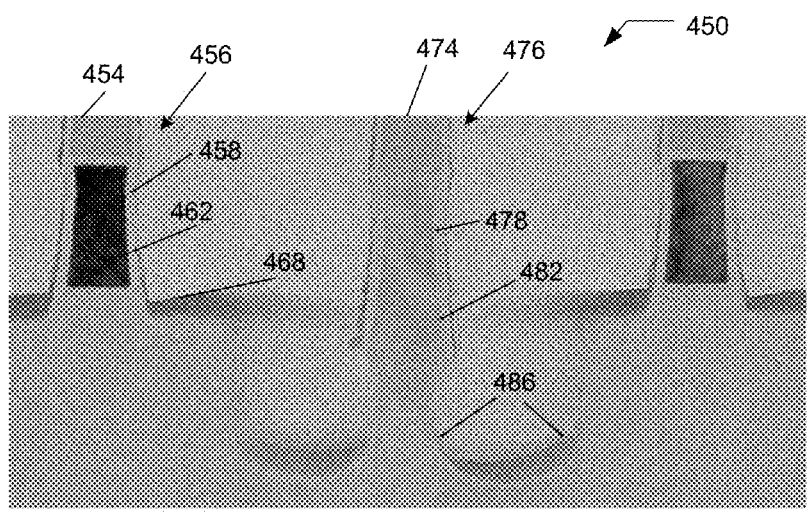
FIG. 4B is an exemplary image of a structure and the protection provided by the passivation layer in another embodiment of the present invention.

FIG. 4B is an exemplary image of structures 450 fabricated using a combination of faceting and the protection provided by the passivation layer in one embodiment of the present invention. The first structure 456 is an exemplary image of a structure fabricated using the combination of faceting and the protection provided by the passivation layer in another embodiment of the present invention. The second structure 476 is also fabricated using a different combination of faceting and the protection provided by the passivation layer in another embodiment of the present invention. The hard mask 474 is retained and most of the near-vertical surfaces 478 and 482 are also protected from the etching process using differential anisotropic etch rates between the near-vertical and the near-horizontal surfaces of the substrate with a passivation layer. In the second structure 476, an isotropic etch process is used instead of the anisotropic etch process used previously, resulting in the substrate being etched in substantially all downward and sideward directions, creating a circular sidewall profile 486 just below the inflection point.

Figure 5:
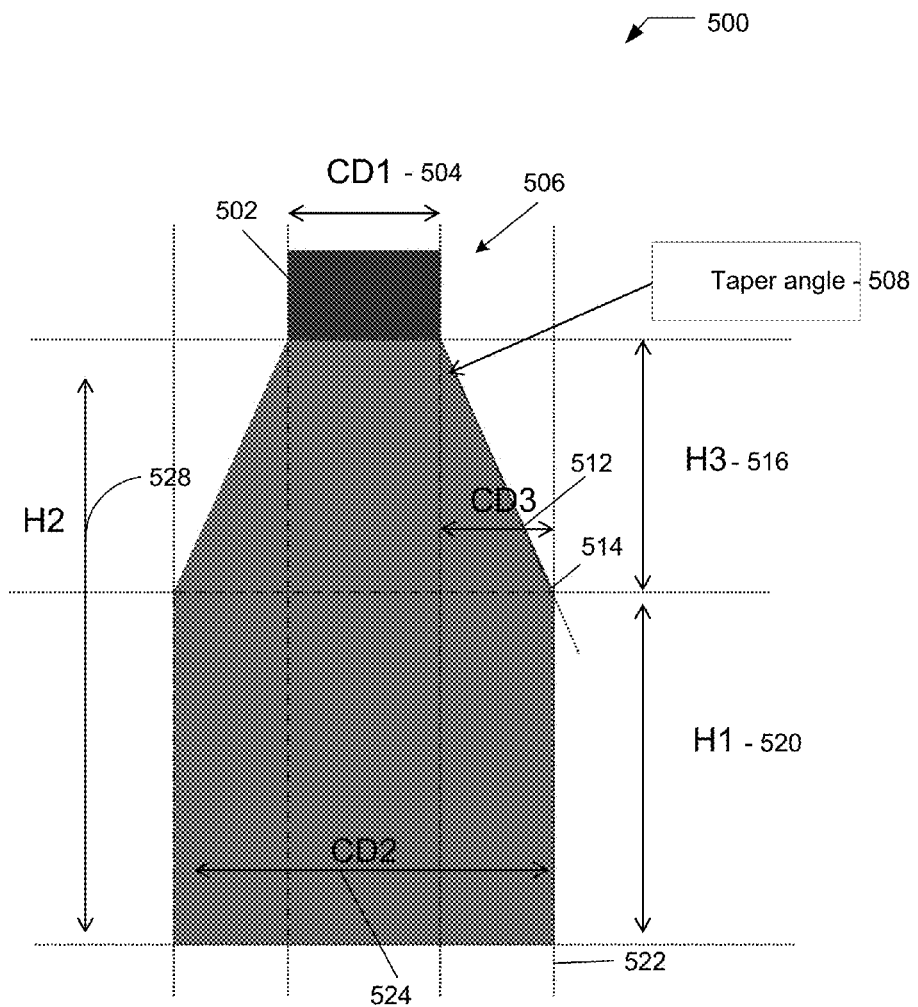
FIG. 5 is an exemplary simplified profile schematic of a target structure in an embodiment of the present invention.

FIG. 5 is an exemplary simplified profile schematic 500 of a target structure in an embodiment of the present invention. There are several target critical dimensions (CDs) and related variables that can be controlled and/or optimized in a fabrication process where an objective includes a target sidewall profile of the structure 506. The CDs include CD1 504 which is the top CD, CD2 524 which is the bottom CD, and CD3 512 which is the width of the facet of the structure 506 at the inflection point 514. Other dimensions of the structure 506 include the height H2, 528 of the structure excluding the hard mask 502, the inflection height H1, 520 of the structure 506 from the underlying layer 522 to the inflection point 514, and the height H3, 516 of the structure 506 from the inflection point 514 to the top of the structure 506 excluding the hard mask 502. Other variables are derivable from others previously listed such as the taper angle 508, tangent of the taper angle 508, CD3 as a function of H3 516, or CD2 524 as a function of H3 516 and CD1 504.

Figure 6:
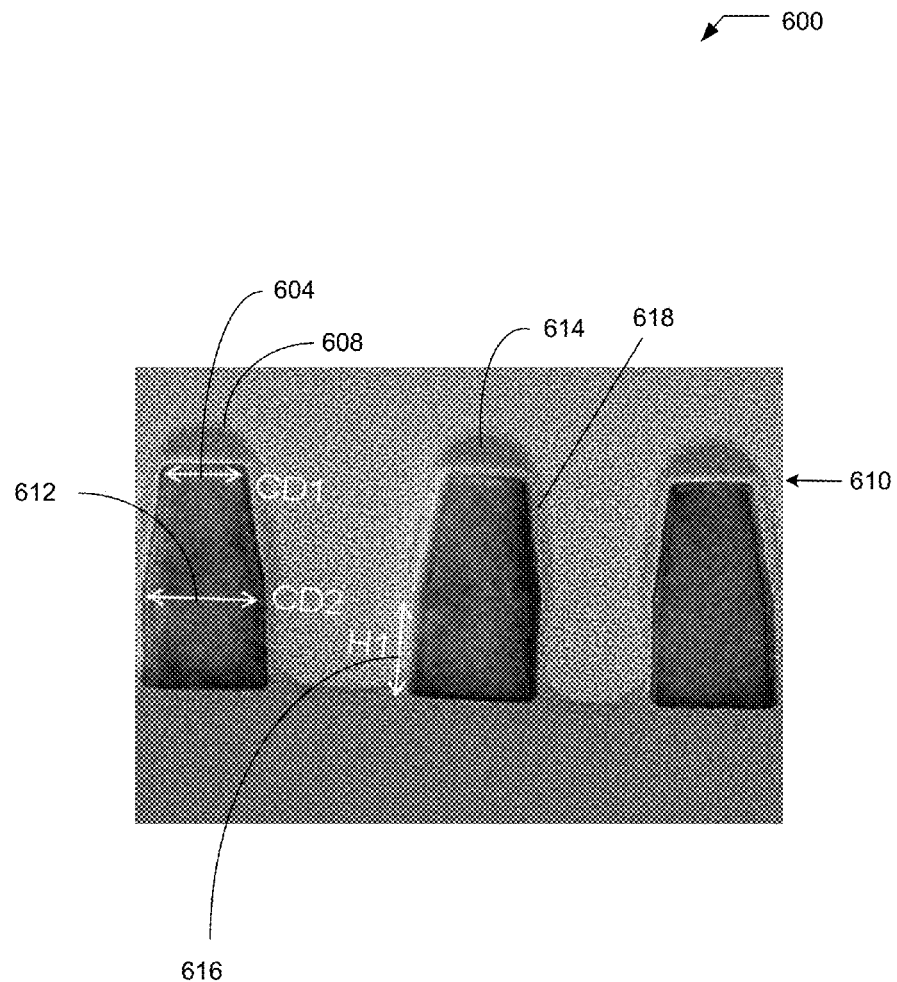
FIG. 6 is an exemplary image of a structure after the plasma etch processes highlighting the target profile critical dimensions and inflection point.

FIG. 6 is an exemplary transmission electron microscopy (TEM) image 600 of a structure 610 after the plasma etch processes highlighting the target profile critical dimensions CD1 608, CD2 612, and inflection height H1 616. The TEM image 600 also highlights the hard mask 614 and the passivation layer 618.

Figure 7A:
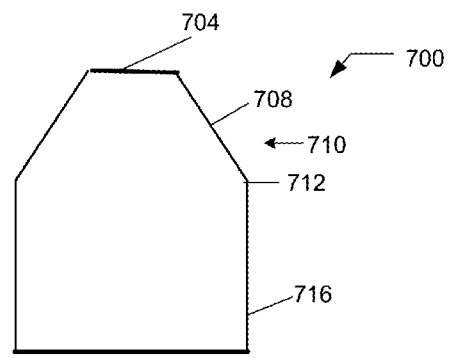
FIG. 7A depicts a target profile of the structure of hexagonal shape where the sides are substantially straight lines and where the inflection point is above the midpoint of the structure height.

FIG. 7A depicts a target profile 700 of the structure of a hexagonal shape where the sides are substantially straight lines and where the inflection point is above the midpoint of the structure height. The hard mask 704 is retained after the faceting etch creating the facet 708 down to an inflection point 712 at substantially the midpoint of the structure height where the inflection height is substantially at the midpoint of the structure height.

Figure 7B:
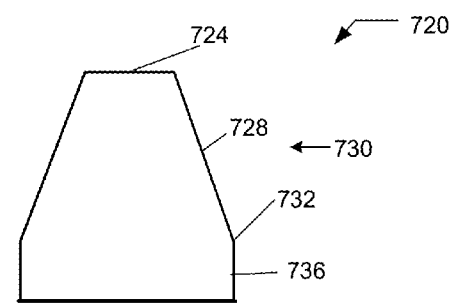
FIG. 7B depicts a target profile of the structure of hexagonal shape where the sides are substantially straight lines where the inflection point is below the midpoint of the structure height.

FIG. 7B depicts a target profile 720 of the structure of a hexagonal shape where the sides are substantially straight lines and where the inflection point 732 is below the midpoint of the structure height. The hard mask 724 is retained after the faceting etch creating the facet 728 down to an inflection point 732 at substantially below the midpoint of the structure height where the inflection height is substantially below the midpoint of the structure height. Alternatively, the inflection point 732 can be substantially above the midpoint of the structure height.

Figure 7C:
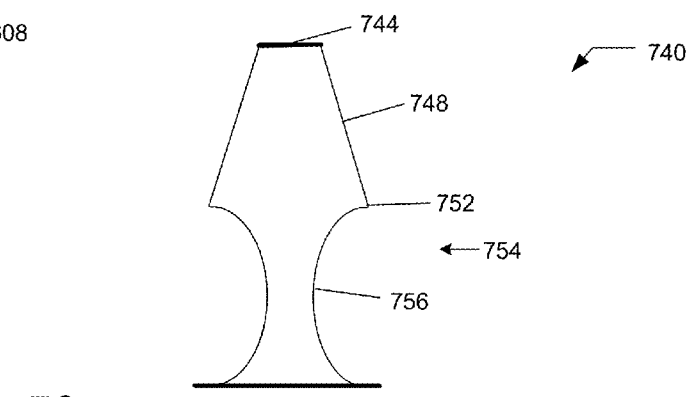
FIG. 7C depicts a target profile of the structure of hexagonal shape where the sides below the inflection point are curved lines.

FIG. 7C depicts a target profile 744 of the structure of a hexagonal shape where the sides below the inflection point are curved lines. The hard mask 744 is retained after the faceting etch creating the facet 748 down to an inflection point 752 at substantially the midpoint or below the midpoint of the structure height where the structure shape 756 is a curved profile as a result of implementing an anisotropic second etch and an isotropic over etch as the third etch process. Alternatively, the inflection point 752 can be substantially above the midpoint of the structure height.

Figure 7D:
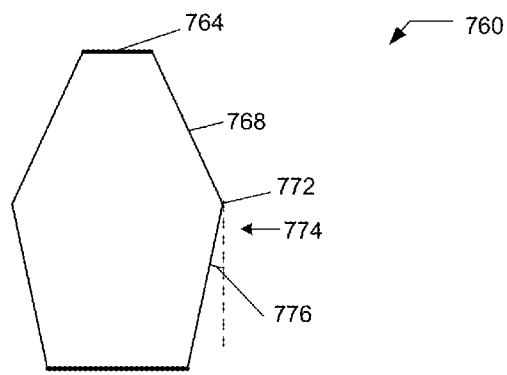
FIG. 7D depicts a target profile of the structure of hexagonal shape where the sides below the inflection point are undercut lines.

FIG. 7D depicts a target profile 760 of the structure of a hexagonal shape where the sides below the inflection point are undercut lines. The hard mask 764 is retained after the faceting etch creating the facet 768 down to an inflection point 772 at substantially the midpoint or below the midpoint of the structure height where the structure shape 776 is an undercut profile as a result of implementing an undercut third etch. Alternatively, the inflection point 772 can be substantially above the midpoint of the structure height.

Figure 7E:
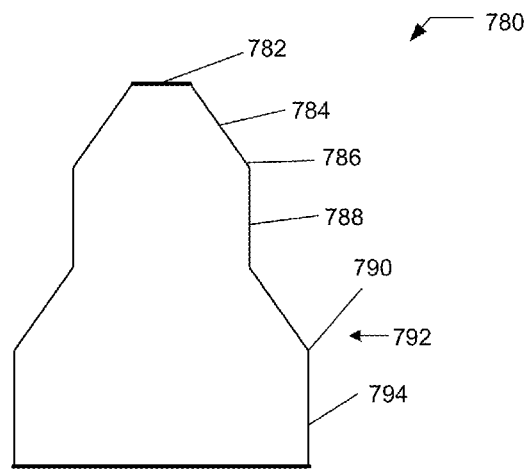
FIG. 7E depicts a target profile of the structure of decagonal shape where the sides are substantially straight lines and where there are two or more inflection points along the structure height.

FIG. 7E depicts a target profile 780 of the structure of a decagonal shape where the sides are substantially straight lines and where there are two inflection points 786 and 790 along the structure height. As can be seen in FIG. 7A to FIG. 7E, the target shape can be a polygon that comprises straight sides, curved sides, or a combination of both straight and curved sides. Furthermore, there can be one or more inflection points along the structure height. By varying the operating variables of the first, second, and third etch process, by using an anisotropic or isotropic etch, or over etching or under etching in a process, or by varying the differential between the first etch rate versus the second etch rate, different or unique sidewall profiles can be fabricated on the structures processed.

Figure 8:
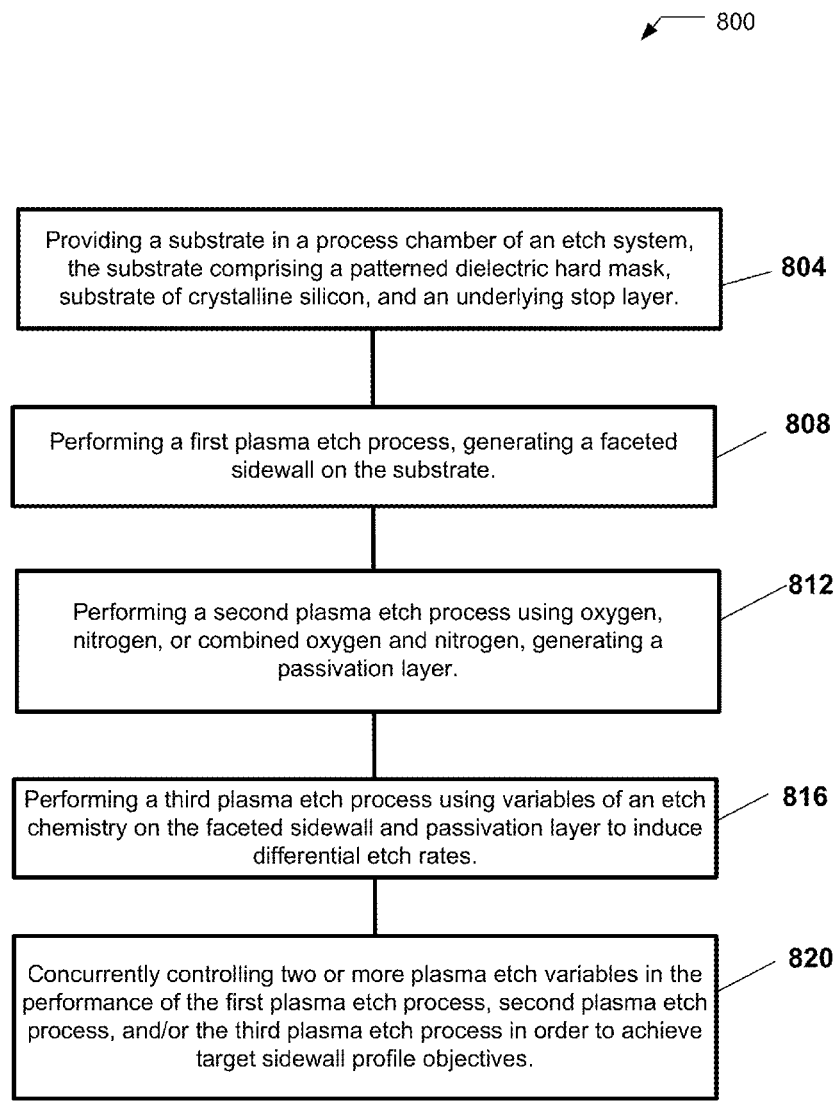
FIG. 8 is an exemplary process flow chart of the method of partial etch memorization using flash addition or a passivation layer.

FIG. 8 is an exemplary process flow chart 800 of the method of partial etch memorization using flash addition or a passivation layer. In operation 804, a substrate is provided in a process chamber of an etch system, the substrate comprising a patterned dielectric hard mask, a substrate of crystalline silicon, and an underlying stop layer. The patterned dielectric hard mask can comprise silicon oxide and the underlying stop layer can comprise silicon nitride. In operation 808, a first plasma etch process is performed, the etch generating a faceted sidewall on the substrate. The etch chemicals used in the first plasma process can comprise HBr/O2/He or HBr/O2/SF6/He. In operation 812, a second plasma etch process is performed using oxygen, nitrogen, or a combination of oxygen and nitrogen, the etch generating a flash addition or passivation layer.

In operation 816, a third plasma etch process using variables of an etch chemistry on the faceted sidewall and passivation layer to induce differential etch rates. The etch chemicals used in the third plasma process can comprise Cl2/SF6/CHF3/O2/N2. The passivation layer in effect functions as a secondary in situ hard mask. Using operating variables of an etch chemistry on the faceted sidewall and the passivation layer to induce differential etch rates to achieve a breakthrough on near-horizontal surfaces of the structure, wherein the third plasma etch used is configured to produce a target sidewall profile on the substrate down to the underlying stop layer. The series of plasma etch processes are configured to achieve targets of the first critical dimension CD1, second critical dimension CD2, and structure height H1 of the substrate. Other targets may include specific shapes such as a hexagon, an octagon, or a decagon and/or different placements of the inflection point along the substrate height. The thickness of the passivation layer can be in a range from 3 to 5 nm. The taper angle can be in a range from 10 to 60 degrees.

In operation 820, two or more plasma etch variables are concurrently controlled in the performance of the first plasma etch process, second plasma etch process, and/or the third plasma etch process in order to achieve target sidewall profile objectives.

Figure 9:
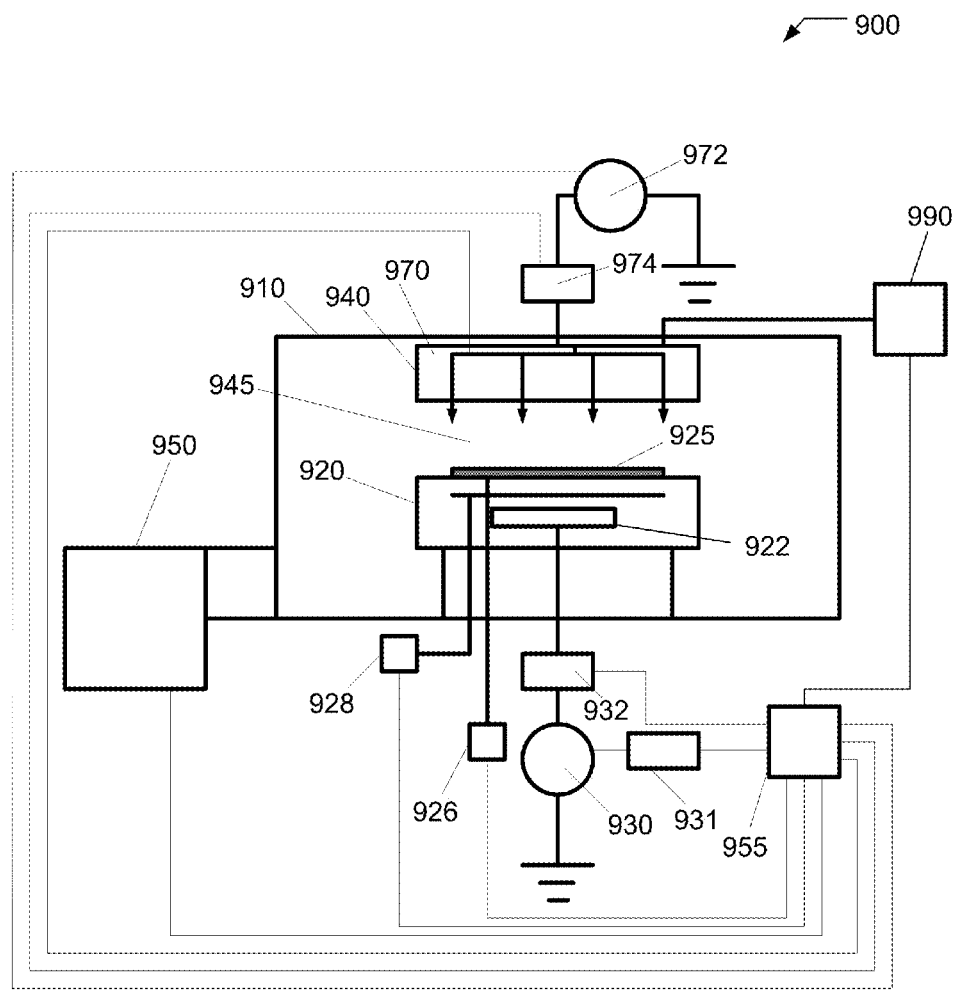
FIG. 9 is an exemplary systems chart for performing the method of method of partial etch memorization using flash addition or a passivation layer in one embodiment of the present invention.

FIG. 9 is an exemplary systems chart for performing the method of partial etch memorization using flash addition or a passivation layer in one embodiment of the present invention. A plasma etching system 900 configured to perform the above identified process conditions is depicted in FIG. 9 comprising a plasma processing chamber 910, substrate holder 920, upon which a substrate 925 to be processed is affixed, and vacuum pumping system 950. Substrate 925 can be a semiconductor substrate, a wafer, a flat panel display, or a liquid crystal display. Plasma processing chamber 910 can be configured to facilitate the generation of plasma in plasma processing region 945 in the vicinity of a surface of substrate 925. An ionizable gas or mixture of process gases is introduced via a gas distribution system 940. For a given flow of process gas, the process pressure is adjusted using the vacuum pumping system 950. Plasma can be utilized to create materials specific to a pre-determined materials process, and/or to aid the removal of material from the exposed surfaces of substrate 925. The plasma processing system 900 can be configured to process substrates of any desired size, such as 200 mm substrates, 300 mm substrates, or larger.

Substrate 925 can be affixed to the substrate holder 920 via a clamping system 928, such as a mechanical clamping system or an electrical clamping system (e.g., an electrostatic clamping system). Furthermore, substrate holder 920 can include a heating system (not shown) or a cooling system (not shown) that is configured to adjust and/or control the temperature of substrate holder 920 and substrate 925. The heating system or cooling system may comprise a re-circulating flow of heat transfer fluid that receives heat from substrate holder 920 and transfers heat to a heat exchanger system (not shown) when cooling, or transfers heat from the heat exchanger system to substrate holder 920 when heating. In other embodiments, heating/cooling elements, such as resistive heating elements, or thermo-electric heaters/coolers can be included in the substrate holder 920, as well as the chamber wall of the plasma processing chamber 910 and any other component within the plasma processing system 900.

Additionally, a heat transfer gas can be delivered to the backside of substrate 925 via a backside gas supply system 926 in order to improve the gas-gap thermal conductance between substrate 925 and substrate holder 920. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 925.

In the embodiment shown in FIG. 9, substrate holder 920 can comprise an electrode 922 through which RF power is coupled to the processing plasma in plasma processing region 945. For example, substrate holder 920 can be electrically biased at a RF voltage via the transmission of RF power from a RF generator 930 through an optional impedance match network 932 to substrate holder 920. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 922 at a RF voltage may be pulsed using pulsed bias signal controller 931. The RF power output from the RF generator 930 may be pulsed between an off-state and an on-state, for example. Alternately, RF power is applied to the substrate holder electrode at multiple frequencies. Furthermore, impedance match network 932 can improve the transfer of RF power to plasma in plasma processing chamber 910 by reducing the reflected power. Match network topologies (e.g. L-type, □-type, T-type, etc.) and automatic control methods are well known to those skilled in the art.

Gas distribution system 940 may comprise a showerhead design for introducing a mixture of process gases. Alternatively, gas distribution system 940 may comprise a multi-zone showerhead design for introducing a mixture of process gases and adjusting the distribution of the mixture of process gases above substrate 925. For example, the multi-zone showerhead design may be configured to adjust the process gas flow or composition to a substantially peripheral region above substrate 925 relative to the amount of process gas flow or composition to a substantially central region above substrate 925.

Vacuum pumping system 950 can include a turbo-molecular vacuum pump (TMP) capable of a pumping speed up to about 8000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 910.

As mentioned above, the controller 955 can comprise a microprocessor, memory, and a digital I/O port capable of generating control voltages sufficient to communicate and activate inputs to plasma processing system 900 as well as monitor outputs from plasma processing system 900. More-over, controller 955 can be coupled to and can exchange information with RF generator 930, pulsed bias signal controller 931, impedance match network 932, the gas distribution system 940, vacuum pumping system 950, as well as the substrate heating/cooling system (not shown), the backside gas supply system 926, and/or the electrostatic clamping system 928. For example, a program stored in the memory can be utilized to activate the inputs to the aforementioned components of plasma processing system 900 according to a process recipe in order to perform a plasma assisted process, such as a plasma etch process, on substrate 925.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

We claim:

1. A method of creating structure profiles on a substrate using faceting and passivation layers, the method comprising:
   providing the substrate in a process chamber of an etch system, the substrate comprising a structure wherein the structure is a patterned hard mask with an underlying stop layer, the patterned hard mask being a dielectric hard mask, the structure above the patterned hard mask having a structure height;
   performing a first plasma etch process generating a faceted sidewall on the substrate, the etch process etching around the pattern hard mask down to a desired inflection point;
   performing a second plasma etch process using an oxygen, nitrogen, or combined oxygen and nitrogen plasma, the second plasma etch process generating a passivation layer;
   performing a third plasma etch process using operating variables of an etch chemistry on the faceted sidewall and the passivation layer to induce differential etch rates to achieve a breakthrough on near-horizontal surfaces of the structure, wherein the third plasma etch used is configured to produce a target sidewall profile on the substrate down to the underlying stop layer;
   wherein use of a faceting technique and a passivation layer are combined to achieve target sidewall profile objectives for the structure.

2. The method of claim 1 further comprising:
   controlling selected two or more plasma etch variables in the performance of the first plasma etch process, the second plasma etch process, and/or the third plasma etch process in order to achieve target sidewall profile objectives.

3. The method of claim 2 wherein the passivation layer functions as a secondary in-situ hard mask.

4. The method of claim 2 wherein a final critical dimension (CD) of the structure is a function of an etch depth of the first plasma process, a taper angle of the sidewall, and a thickness of the passivation layer.

5. The method of claim 2 wherein etch chemicals used in the first plasma process comprises HBr/O2/He or HBr/O2/SF6/He.

6. The method of claim 2 wherein etch chemicals used in the third plasma process comprises Cl2/SF6/CHF3/O2/N2.

7. The method of claim 2 wherein the underlying stop layer comprises silicon oxide, the patterned hard mask comprises silicon nitride, and the pattern hard mask was produced using an image transfer process.

8. The method of claim 2 wherein the taper angle of the sidewall faceting and the thickness of the passivation layer facilitate the differential etch rate to achieve breakthrough in near-horizontal surfaces of the structure in the third plasma etch process.

9. The method of claim 2 wherein the third etch process is an anisotropic etch and the inflection point is located above a halfway point of the structure height.

10. The method of claim 2 wherein the third etch process is an anisotropic etch and the inflection point is located at a halfway point of the structure height.

11. The method of claim 2 wherein the third etch process is an anisotropic etch and the inflection point is located below a halfway point of the structure height.

12. The method of claim 2 wherein the third etch process includes an anisotropic etch and an isotropic overetch and the inflection point is located below a halfway point of the structure height.

13. The method of claim 2 wherein the third etch process include an anisotropic etch and the inflection point is located above a halfway point of the structure height where the etching produces an undercut in the structure.

14. The method of claim 2 wherein the third etch process include an anisotropic etch and the inflection point is located at a halfway point of the structure height where the etching produces an undercut in the structure.

15. The method of claim 2 wherein the third etch process include an anisotropic etch and the inflection point is located below a halfway point of the structure height where the etching produces an undercut in the structure.

16. The method of claim 2 wherein the thickness of the passivation layer is in a range from 3 to 5 nm.

17. The method of claim 2 wherein the taper angle is in a range from 10 to 60 degrees.

18. The method of claim 2 wherein the target sidewall profile is a hexagonal shape with sides that are straight lines.

19. The method of claim 2 wherein the target sidewall profile is a hexagonal shape with sides that are straight lines and wherein two sides of the hexagonal shape immediately above the underlying stop layer are vertical.

20. The method of claim 2 wherein the target sidewall profile is a hexagonal shape with sides that are straight lines and wherein two sides of the hexagonal shape immediately above the underlying stop layer are directed inwards in an undercut.

21. The method of claim 2 wherein the target sidewall profile is a hexagonal shape having a combination of straight lines and curved lines.

22. The method of claim 2 wherein the second etch process is performed two or more times, each time generating a corresponding passivation layer and a corresponding inflection point.

23. The method of claim 22 wherein the target profile is a polygonal shape that has a number of sides proportional to the number of second plasma etch processes and third plasma etch processes performed.

24. The method of claim 22 wherein the target profile is a polygonal shape of straight lines if anisotropic etch processes are used in the third plasma etch process or curved lines if a combination of anisotropic and isotropic etch processes are used in the third plasma etch process.

25. The method of claim 22 wherein the target profile is a polygonal shape of straight lines if anisotropic etch processes are used in the third plasma etch process or straight undercut lines if undercutting etch processes are used in the third plasma etch process.

26. The method of claim 1 wherein the plasma etch variables comprises process chamber temperature, power to the plasma source, flowrate of etch chemicals and gases, process duration, and pressure used in the first plasma etch process, the second plasma etch process, and/or the third plasma etch process.

27. A system for processing a substrate in order to achieve target sidewall target profile, the system comprising:
an etch system comprising a process chamber coupled to plasma generator, an etchant gas delivery system, a controller, a power source, and a vacuum system,
wherein the controller is configured to perform a first plasma etch process generating a faceted sidewall on the substrate, the etch process etching around the pattern hard mask down to a desired inflection point; a second plasma etch process using an oxygen, nitrogen, or combined oxygen and nitrogen plasma, the second plasma etch process generating a passivation layer; and a third plasma etch process using operating variables of an etch chemistry on the faceted sidewall and the passivation layer to induce differential etch rates to achieve a breakthrough on near-horizontal surfaces of the structure, wherein the third plasma etch used is configured to produce a target sidewall profile on the substrate down to the underlying stop layer;
wherein use of a faceting technique and a passivation layer are combined to achieve target sidewall profile objectives for the structure.

* * * * *